(12) United States Patent
Chen

(10) Patent No.: US 10,932,359 B2
(45) Date of Patent: Feb. 23, 2021

(54) CIRCUIT BOARD AND ELECTRICAL CONNECTOR WITH THE SAME

(71) Applicant: OUPIIN ELECTRONIC (KUNSHAN) CO., LTD., Jiangsu Province (CN)

(72) Inventor: Hsin Chih Chen, Jiangsu Province (CN)

(73) Assignee: OUPIIN ELECTRONIC (KUNSHAN) CO., LTD., Kunshan (CN)

( * ) Notice: Subject to any disclaimer, the term of this patent is extended or adjusted under 35 U.S.C. 154(b) by 31 days.

(21) Appl. No.: 16/600,509

(22) Filed: Oct. 13, 2019

(65) Prior Publication Data

US 2020/0128660 A1 Apr. 23, 2020

(30) Foreign Application Priority Data

Oct. 17, 2018 (CN) .......... 201811206814.5
Oct. 17, 2018 (CN) .......... 201821679815.7

(51) Int. Cl.
| | |
|---|---|
| *H05K 1/00* | (2006.01) |
| *H05K 1/02* | (2006.01) |
| *H05K 1/03* | (2006.01) |
| *H05K 9/00* | (2006.01) |
| *H01P 3/08* | (2006.01) |
| *H05K 1/18* | (2006.01) |
| *H01R 24/64* | (2011.01) |
| *H01R 12/53* | (2011.01) |
| *H05K 1/11* | (2006.01) |

(52) U.S. Cl.
CPC ......... *H05K 1/0228* (2013.01); *H05K 1/0245* (2013.01); *H05K 1/18* (2013.01); *H01R 12/53* (2013.01); *H01R 24/64* (2013.01); *H05K 1/112* (2013.01); *H05K 2201/1031* (2013.01)

(58) Field of Classification Search
CPC .. H05K 1/00; H05K 1/02; H05K 1/03; H05K 1/111; H05K 1/0219; H05K 1/0224; H05K 1/0228; H05K 1/0245; H05K 1/0253; H05K 9/00; H05K 9/0039; H01P 3/08; H01P 3/026
USPC .... 361/748, 777; 174/33, 34, 250, 251, 260; 333/5, 238
See application file for complete search history.

(56) References Cited

U.S. PATENT DOCUMENTS 5,357,050 A * 10/1994 Baran .................. H05K 1/0228
174/261
8,330,047 B2 * 12/2012 Ho .......................... G11B 5/486
174/250

(Continued)

*Primary Examiner* — Xiaoliang Chen
(74) *Attorney, Agent, or Firm* — Mark M. Friedman

(57) ABSTRACT

A circuit board and an electrical connector with the same are disclosed in the present invention. The circuit board includes a first line layer, a first insulating layer, a second line layer, an insulating substrate, a third line layer, a second insulating layer and a fourth line layer, which are stacked from top to bottom. A first metal line and a second metal line are formed on the first line layer and the second line layer, respectively, and together constitute a first differential line pair. A third metal line and a fourth metal line are formed on the third line layer and the fourth line layer, respectively, and together constitute a second differential line pair. Two metal lines constituting each differential line pair are arranged up and down and have different widths, thereby reducing signal crosstalk between adjacent differential line pairs.

9 Claims, 10 Drawing Sheets

(56) References Cited

U.S. PATENT DOCUMENTS

| | | | |
|---|---|---|---|
| 9,118,516 B1* | 8/2015 | Ao | H04L 25/0278 |
| 10,306,749 B1* | 5/2019 | Mutnury | H05K 1/0245 |
| 2007/0222052 A1* | 9/2007 | Kabumoto | H05K 1/0224 |
| | | | 257/679 |
| 2012/0229998 A1* | 9/2012 | Kagaya | H01P 1/02 |
| | | | 361/777 |
| 2013/0162364 A1* | 6/2013 | Lin | H01P 3/08 |
| | | | 333/5 |
| 2017/0019145 A1* | 1/2017 | Mutnury | H01P 3/08 |
| 2017/0098880 A1* | 4/2017 | Hidaka | H01P 3/026 |
| 2017/0325331 A1* | 11/2017 | Chuo | H05K 1/0245 |

* cited by examiner

CIRCUIT BOARD AND ELECTRICAL CONNECTOR WITH THE SAME

BACKGROUND OF THE INVENTION

1. Field of the Invention

The present invention relates to a connector technology, and more particularly to a circuit board and an electrical connector with the same, which are capable of transmitting differential signals.

2. Description of the Prior Art

A differential signal is a kind of signal transmission technology. It is more and more widely used in high-speed circuit designs. A differential structure is often used for the most critical signal in the circuit, and a pair of lines carrying the differential signal is called a differential line pair.

In an actual PCB layout wiring, a traditional structure of the differential line pair cannot effectively reduce the crosstalk noise between adjacent differential line pairs, so it will affect the signal integrity of high-speed systems.

Hence, it is necessary to provide a new circuit board that adopts a new wiring method to solve the problems existing in the existing technology.

BRIEF SUMMARY OF THE INVENTION

One object of the present invention is to provide a circuit board to transmit differential signals for reducing signal crosstalk between adjacent differential line pairs.

The other object of the present invention is to provide an electrical connector, which adopt a new circuit board for reducing signal crosstalk between adjacent differential line pairs.

Other objects and advantages of the present invention may be further understood from the technical features disclosed by the present invention.

To achieve the aforementioned object or other objects of the present invention, the present invention adopts the following technical solution.

The present invention provides a circuit board, comprising a first line layer, a first insulating layer, a second line layer, an insulating substrate, a third line layer, a second insulating layer and a fourth line layer, which are stacked from top to bottom. The first line layer is provided with at least one first metal line, the second line layer is provided with at least one second metal line, and the first metal line and the second metal line constitute one first differential line pair. The third line layer is provided with at least one third metal line, the fourth line layer is provided with at least one fourth metal line, and the third metal line and the fourth metal line constitute one second differential line pair. Wherein two metal lines constituting each differential line pair are arranged up and down and have different widths.

In one embodiment, the width of the first metal line is greater than that of the second metal line, and the width of the fourth metal line is greater than that of the third metal line.

In one embodiment, the two metal lines constituting each differential line pair both have at least one path, and the paths of the two metal lines are staggered from each other; and orthographic projections of the paths of the two metal lines are located in one projection region and interlaced with each other.

In one embodiment, the two metal lines constituting each differential line pair both have at least one serpentine path.

In one embodiment, one of the two metal lines constituting each differential line pair has at least one serpentine path, and the other of the two metal lines has at least one straight path; the serpentine path and the straight path are arranged up and down and staggered from each other.

In one embodiment, the serpentine path is disposed on the first metal line, and the straight path is disposed on the second metal line.

In one embodiment, the insulating substrate has a first surface and a second surface, which are parallel to each other; the second line layer is a metal layer laid on the first surface and further forms another second metal line; the first insulating layer covers the second line layer; the first line layer is a metal layer disposed on the first insulating layer and further forms another first metal line; the another first metal line and the another second metal line constitute a third differential line pair; the third line layer is a metal layer laid on the second surface of the insulating substrate and further forms another third metal line; the second insulating layer covers the third line layer; and the fourth line layer is a metal layer disposed on the second insulating layer and further forms another fourth metal line; the another third metal line and the another fourth metal line constitute a fourth differential line pair.

In one embodiment, the circuit board is further provided with multiple conductive through holes, each of which passes through a top surface and a bottom surface of the circuit board; each conductive through hole is corresponding to one metal line and is connected with one end of the metal line.

The present invention further provides an electrical connector with above circuit board. The electrical connector comprises multiple conductive terminals mounted on the circuit board; wherein each conductive terminal is electrically connected with one end of one corresponding metal line of the circuit board.

In comparison with the prior art, the circuit board and the electrical connector with the same in the present invention dispose the two metal lines constituting each differential line pair to be located in different line layers, and the two metal lines have different widths. Some paths of the two metal lines are staggered from each other, and their orthographic projections are located in the same projection region and interlaced with each other, thereby ensuring that the two metal lines are closed to each other and enhancing the coupling between them. Meanwhile, the layout of the differential line pairs can further reduce signal crosstalk between adjacent differential line pairs.

DETAILED DESCRIPTION OF THE PREFERRED EMBODIMENTS

The following description of every embodiment with reference to the accompanying drawings is used to exemplify a specific embodiment, which may be carried out in the present invention. Directional terms mentioned in the present invention, such as "up", "down", "front", "back", "left", "right", "top", "bottom" "above", "below" etc., are only used with reference to the orientation of the accompanying drawings. Therefore, the used directional terms are intended to illustrate, but not to limit, the present invention.

Figure 1:
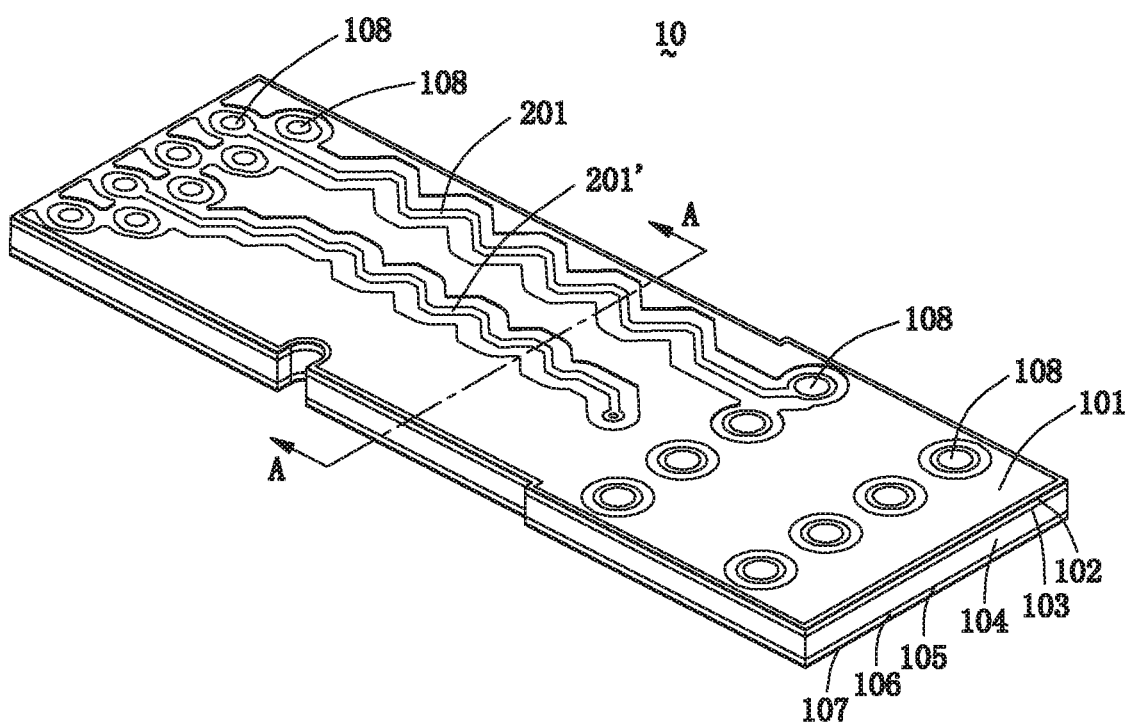
FIG. 1 is a structure schematic view of a first embodiment of a circuit board of the present invention.
Figure 2:
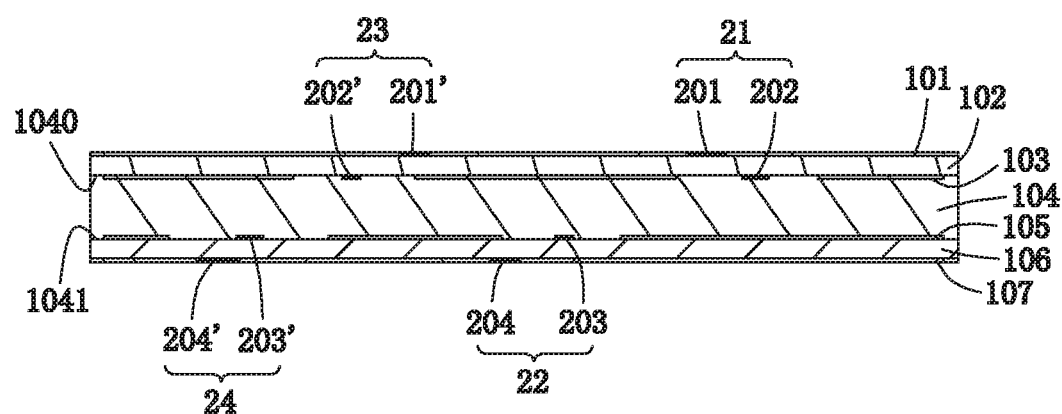
FIG. 2 is a sectional view of the circuit board along an A-A line shown in FIG. 1.

Please refer to FIGS. 1 and 2, a circuit board 10 of the present invention is stacked from top to bottom with a first line layer 101, a first insulating layer 102, a second line layer 103, an insulating substrate 104, a third line layer 105, a second insulating layer 106 and a fourth line layer 107. The first line layer 101 is provided with at least one first metal line 201, the second line layer 103 is provided with at least one second metal line 202, and the first metal line 201 and the second metal line 202 form one differential line pair. Moreover, the third line layer 105 forms at least one third metal line 203, the fourth line layer 107 forms at least one fourth metal line 204, and the third metal line 203 and the fourth metal line 204 also constitute one differential line pair.

Figure 5:
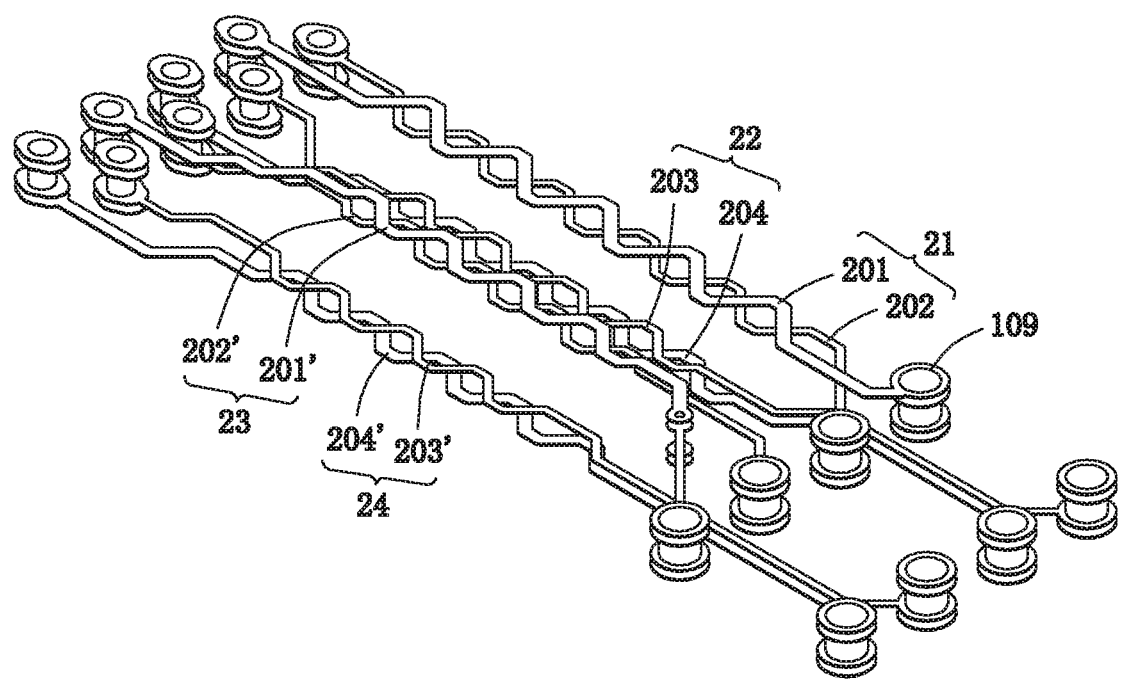
FIG. 5 is a layout diagram of differential line pairs in the first embodiment of the present invention.

More specifically, please refer to FIGS. 2 and 5, in a first embodiment, the first metal line 201 and the second metal line 202 are arranged up and down and staggered from each other to constitute a first differential line pair 21. Further, the third metal line 203 and the fourth metal line 204 are arranged up and down and staggered from each other to constitute a second differential line pair 22.

Please refer to FIGS. 2 and 5, in the first embodiment, the first line layer 101 and the second line layer 103 further form another differential line pair, namely a third differential line pair 23. The third line layer 105 and the fourth line layer 107 also form another differential line pair, namely a fourth differential line pair 24. More in detail, the first line layer 101 is further provided with another first metal line 201', the second line layer 103 is further provided with another second metal line 202', and the another first metal line 201' and the another second metal line 202' constitute the third differential line pair 23. Furthermore, the third line layer 105 is further provided with another third metal line 203', the fourth line layer 107 is further provided with another fourth metal line 204', and the another third metal line 203' and the another fourth metal line 204' constitute the fourth differential line pair 24.

Figure 3:
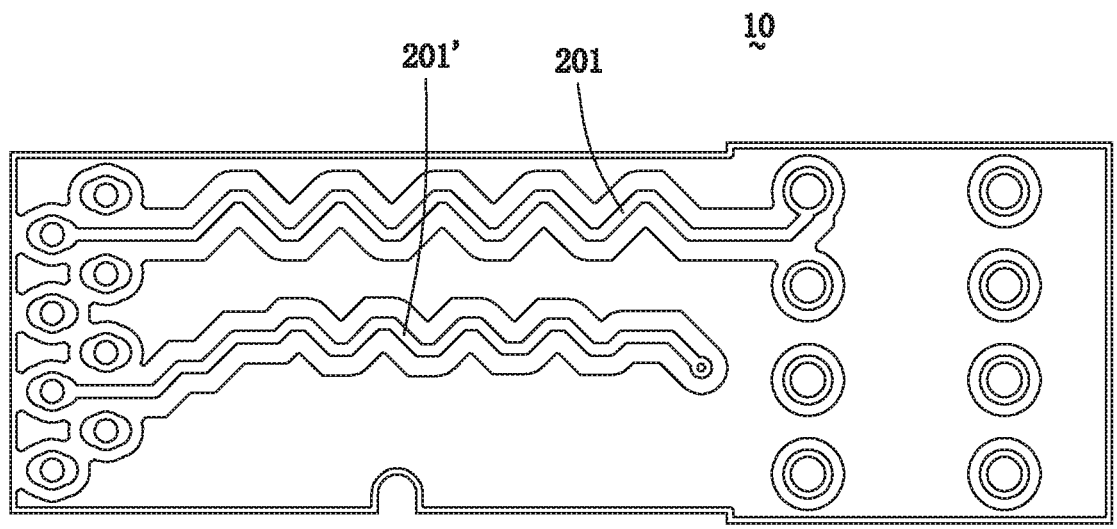
FIG. 3 is a top plan view of the circuit board shown in FIG. 1.

Referring to FIG. 3, the above two first metal lines 201, 201' can be seen on a top of the circuit board 10. Of course, the top of the circuit board 10 can be coated with a solder resistance paint to provide an insulation protection for the first metal lines 201, 201'.

Figure 4:
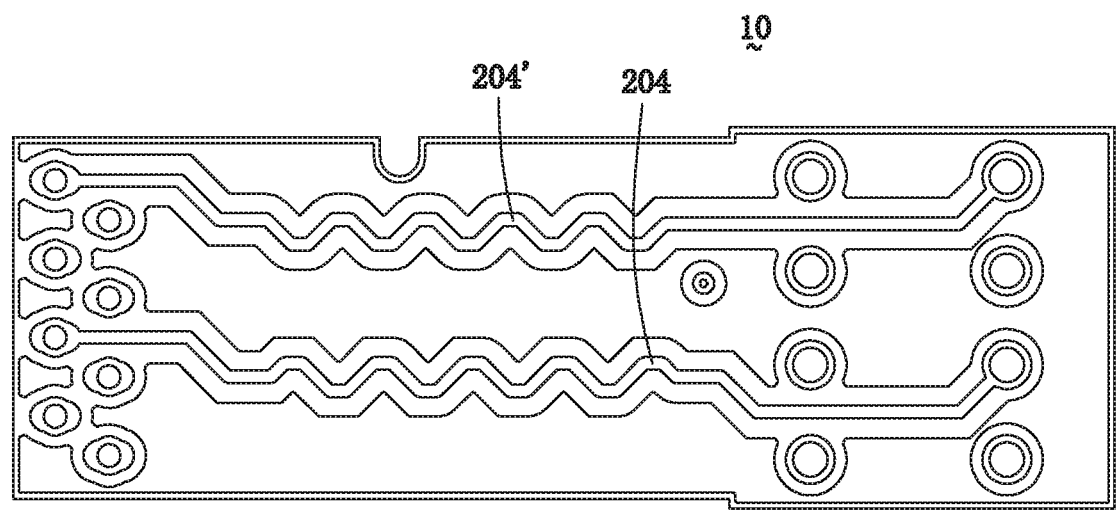
FIG. 4 is a bottom plan view of the circuit board shown in FIG. 1.

Referring to FIG. 4, the above two fourth metal lines 204, 204' can be seen on a bottom of the circuit board 10. Of course, the bottom of the circuit board 10 can also be coated with the solder resistance paint to provide an insulation protection for the fourth metal lines 204, 204'.

In the first embodiment, as shown in FIG. 2, two metal lines constituting each differential line pair are located in different line layers to reduce signal crosstalk between adjacent differential line pairs. Now take the first differential line pair as an example, the first metal line 201 and the second metal line 202, which constitute the first differential line pair 21, are located in the first line layer 101 and the second line layer 103 respectively, and their widths are different. For example, the width of the first metal line 201 is greater than that of the second metal line 202. In this embodiment, the width of the fourth metal line 204 is greater than that of the third metal line 203.

In the first embodiment, as shown in FIG. 5, the two metal lines constituting each differential line pair both have at least one path, and the paths of the two metal lines are staggered from each other. In a direction perpendicular to the top of the circuit board (i.e. an overlooking direction of the circuit board), orthographic projections of the paths of the two metal lines are located in one projection region and are interlaced to each other, thereby ensuring that the two metal lines are closed to each other and enhancing the coupling between them. Now take the first differential line pair 21 as an example, the two metal lines 201, 202 of the first differential line pair 21 both have at least one serpentine path, which can also be called as an S-shaped path, or a winding path. The serpentine paths of the two metal lines 201, 202 are staggered from each other, and their orthographic projections are located in the same projection region, such as a banded projection region 30 (seen in FIG. 6), and are interlaced to each other. In this embodiment, the serpentine path of each metal line is generally located in a middle of the metal line. For example, the serpentine path of the first metal line 201 is located in a middle of the first metal line 201.

Each layer of the circuit board 10 of the present invention will be described in detail below.

Referring to FIG. 2, the insulating substrate 104 has a first surface 1040 and a second surface 1041. The first surface 1040 is parallel to the second surface 1041. The insulating substrate 104 is made of insulating, heat-insulating and non-flexible materials. In the first embodiment, the insulating substrate 104 can be made of glass epoxy or similar materials.

Referring to FIG. 2, the second line layer 103 is formed on the first surface 1040 of the insulating substrate 104. For example, the second line layer 103 may be a thin metal layer laid on the first surface 1040 to form at least one second metal line 202 by etching or other means. In the first embodiment, the second line layer 103 forms two second metal lines 202, 202'.

Referring to FIG. 2, the first insulating layer 102 covers the second line layer 103 for providing an isolation function.

Referring to FIG. 2, the first line layer 101 is formed on the first insulating layer 102 in the same way as the second line layer 103. The first line layer 101 forms at least one first metal line 201 by etching or other means. In the first embodiment, the first line layer 101 forms two first metal lines 201, 201', which are shown in FIGS. 1 to 3.

Similarly, referring to FIG. 2, the third line layer 105 is formed on the second surface 1041 of the insulating substrate 104. In the first embodiment, the third line layer 105 forms two third metal lines 203, 203'.

Referring to FIG. 2, the second insulating layer 106 covers the third line layer 105 for providing an isolation function.

Referring to FIG. 2, the fourth line layer 107 is formed on the second insulating layer 106. In the first embodiment, the fourth line layer 107 forms two fourth metal lines 204, 204', which are shown in FIGS. 2 and 4.

Figure 6:
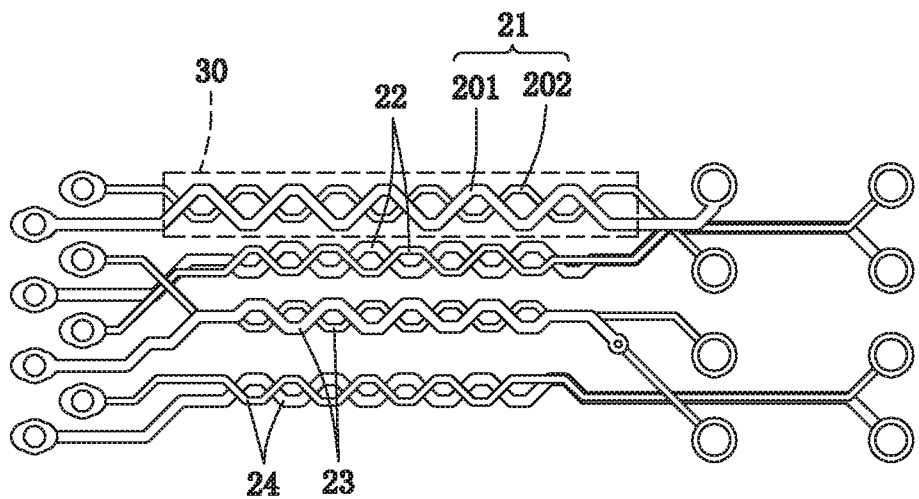
FIG. 6 is a top plan view of the differential line pairs of FIG. 5.
Figure 7:
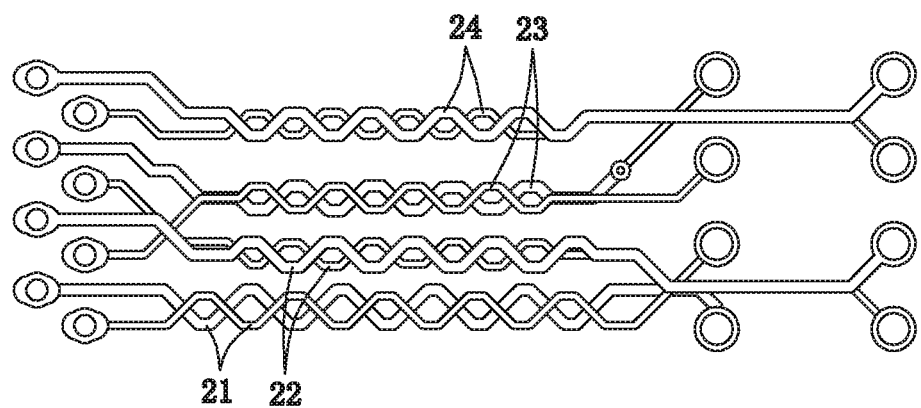
FIG. 7 is a bottom plan view of the differential line pairs of FIG. 5.

FIGS. 6 and 7 show a top view and a bottom view of the differential line pairs of the present invention, respectively, to clearly display layout structures of the first differential line pair 21, the second differential line pair 22, the third differential line pair 23 and the fourth differential line pair 24. The two metal lines constituting each differential line pair both have at least one serpentine path, which can also be called as an S-shaped path, or a winding path. The serpentine paths of the two metal lines are staggered from each other, and their orthographic projections are located in the same projection region, such as the banded projection region 30 (seen in FIG. 6), and are interlaced with each other.

But the paths of the differential line pair cannot be limited to be only the serpentine shape shown in the first embodiment. Namely, the paths of the differential line pair also can be a zigzag shape.

Figure 8:
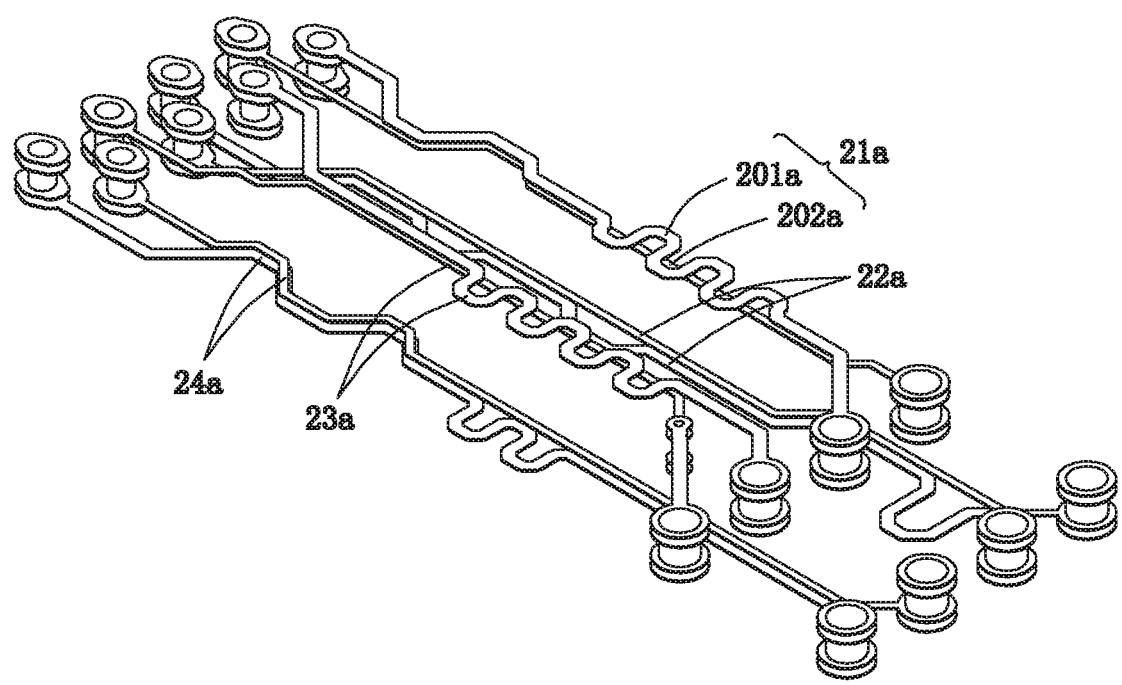
FIG. 8 is a layout diagram of differential line pairs in a second embodiment of the present invention.
Figure 9:
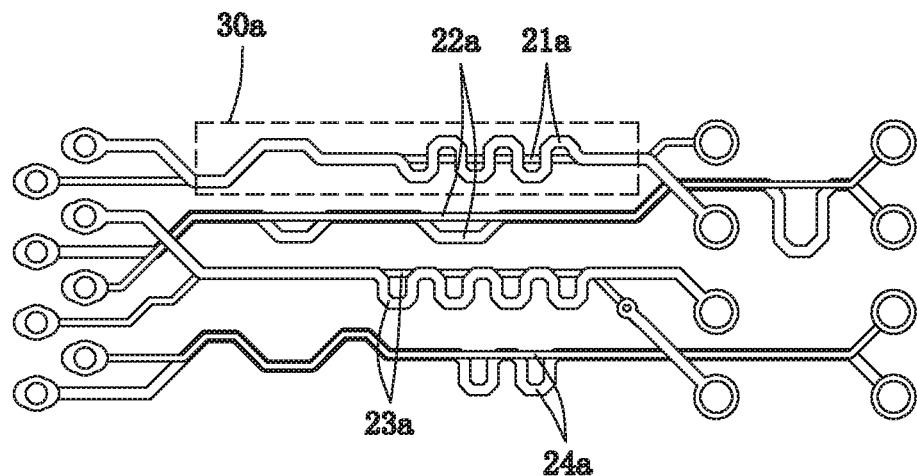
FIG. 9 is a top plan view of the differential line pairs of FIG. 8.
Figure 10:
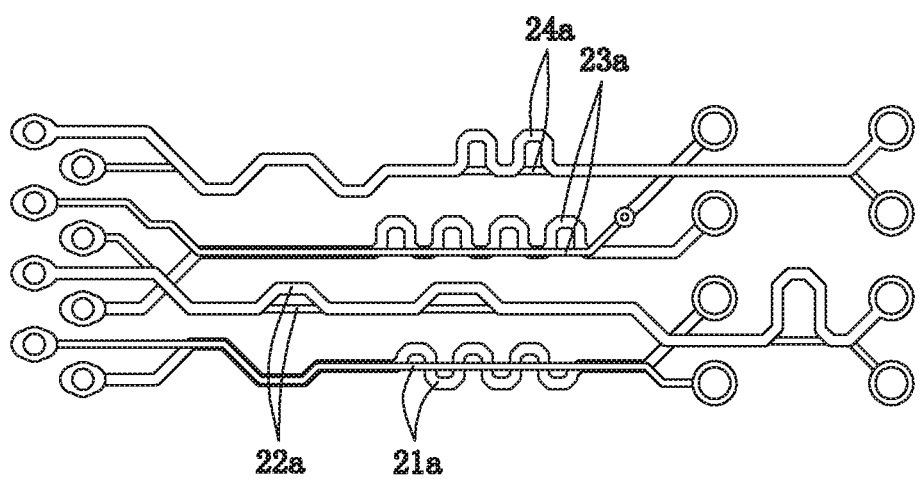
FIG. 10 is a bottom plan view of the differential line pairs of FIG. 8.

FIGS. 8 to 10 show a second embodiment of the differential line pair of the present invention. The second embodiment provides a first differential line pair 21a, a second differential line pair 22a, a third differential line pair 23a and a fourth differential line pair 24a, which are similar to the first embodiment. Two metal lines constituting each differential line pair are located in different line layers and have different widths. The two metal lines constituting each differential line pair both have at least one path, and the paths of the two metal lines do not overlap, but are staggered from each other. Orthographic projections of the paths of the two metal lines are located in one projection region and interlaced with each other, thereby ensuring that the two metal lines are closed to each other and enhancing the coupling between them. Further specifically, one metal line constituting each differential line pair has at least one serpentine path, and the other metal line has at least one straight path. The serpentine path and the straight path are interlaced with each other, and their orthographic projections are located in the same projection region, such as a banded projection region 30a (seen in FIG. 9) and are interlaced with each other.

Please refer to FIG. 8, take the first differential line pair 21a as an example, one metal line (namely a first metal line 201a) of the first differential line pair 21a has at least one serpentine path, and the other metal line (namely a second metal line 202a) of the first differential line pair 21a has at least one straight path. The serpentine path and the straight path do not overlap, but are staggered from each other. Orthographic projections of the serpentine path and the straight path are located in the same projection region and interlaced with each other.

In the embodiment, the serpentine path and the straight path are generally located in a middle of the corresponding metal lines.

Moreover, referring to FIG. 1, the circuit board 10 is further provided with multiple conductive through holes 108, each of which passes through a top surface and a bottom surface of the circuit board 10. Each conductive through hole is corresponding to one metal line and is connected with one end of the metal line. More specifically, each metal line includes two welding pads 109 (seen in FIG. 5) formed at two ends thereof. Each welding pad 109 is electrically connected with one corresponding conductive through hole 108.

Figure 11:
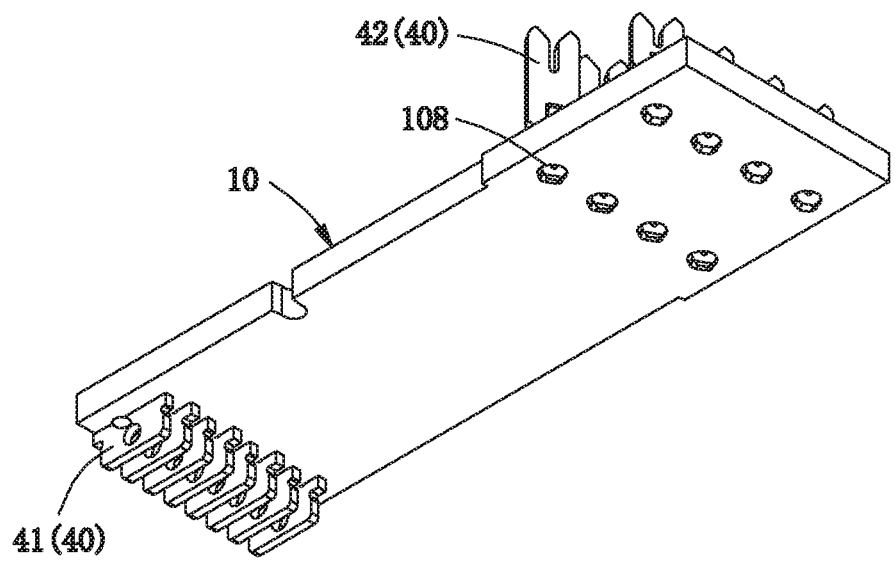
FIG. 11 is a usage status diagram of the circuit board of the present invention.
Figure 12:
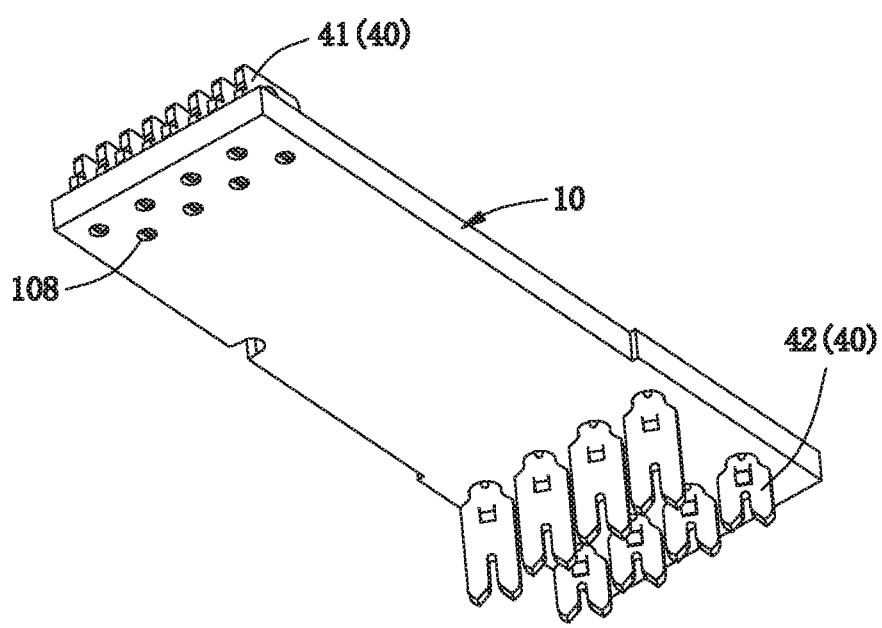
FIG. 12 is a usage status diagram of the circuit board of the present invention from another angle.

Please refer to FIGS. 11 and 12, each conductive through hole 108 on the circuit board 10 can be used to be welded with an outer conductive terminal 40, or the outer conductive terminal 40 may be inserted into the corresponding conductive through hole 108, thereby forming an electrical connection.

Figure 13:
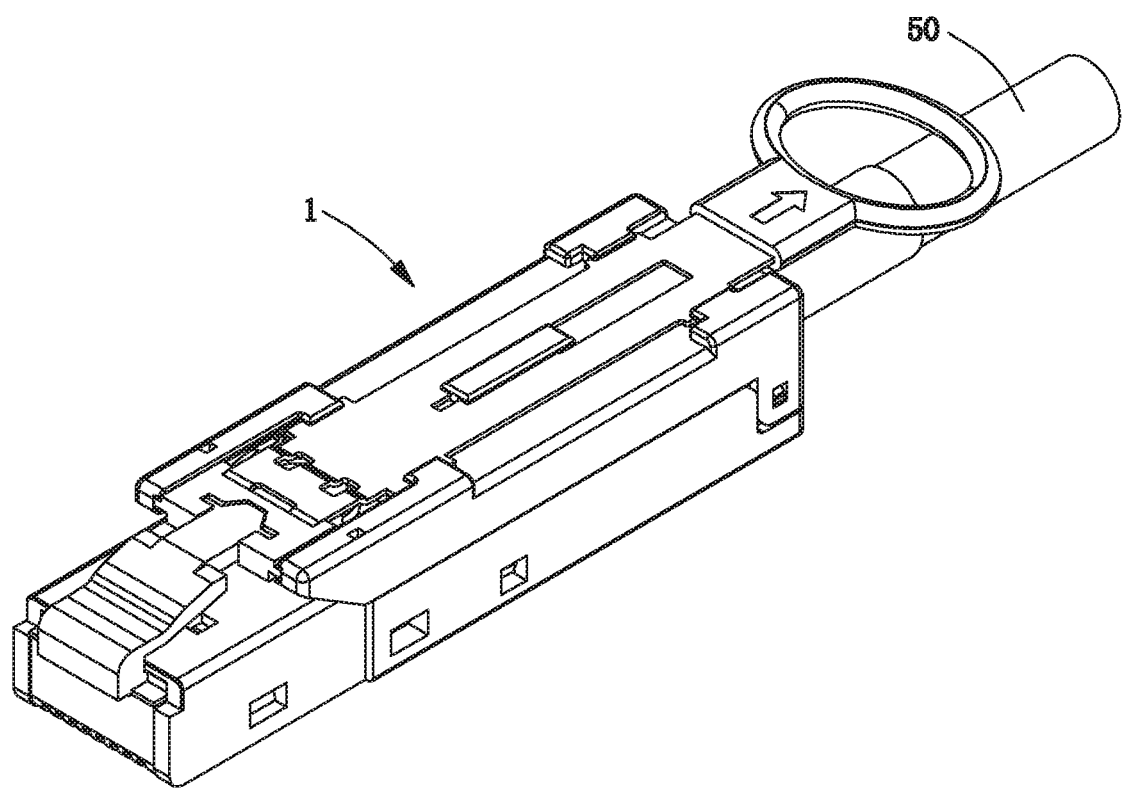
FIG. 13 is a schematic view of an electrical connector of the present invention.
Figure 14:
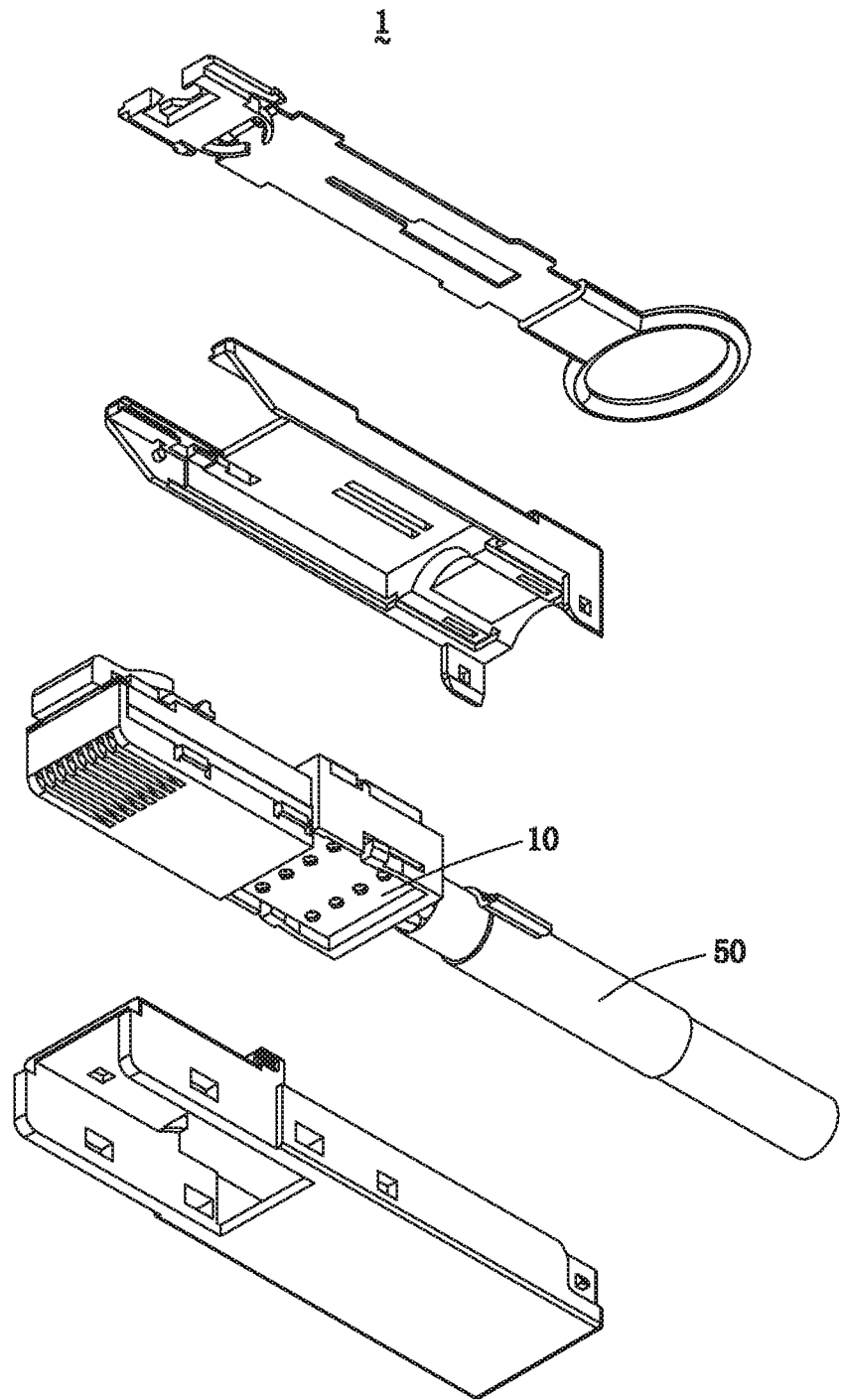
FIG. 14 is an exploded view of the electrical connector of the present invention.

Please refer to FIGS. 13 and 14, an electrical connector 1 of the present invention employs the circuit board 10 shown in FIG. 1.

Please refer to FIGS. 11 to 14, the electrical connector 1 includes multiple conductive terminals 40 mounted on the circuit board 10. Each conductive terminal 40 is electrically connected with one end of one corresponding metal line on the circuit board 10. Further, the conductive terminals 40 include multiple front terminals 41 and multiple rear terminals 42. The front terminals 41 can be electrically connected with a complementary connector (not shown in all FIGS), and each of the rear terminals 42 is forked and can be electrically connected with a cable 50 of the electrical connector 1.

As described above, the circuit board 10 and the electrical connector 1 with the same in the present invention dispose the two metal lines constituting each differential line pair to be located in different line layers, and the two metal lines have different widths. Some paths of the two metal lines are staggered from each other, and their orthographic projections are located in the same projection region and interlaced with each other, thereby ensuring that the two metal lines are closed to each other and enhancing the coupling between them. Meanwhile, the layout of the differential line pairs can further reduce signal crosstalk between adjacent differential line pairs.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A circuit board, comprising a first line layer, a first insulating layer, a second line layer, an insulating substrate, a third line layer, a second insulating layer and a fourth line layer, which are stacked from top to bottom;

the first line layer being provided with at least one first metal line, the second line layer being provided with at least one second metal line, and the first metal line and the second metal line constituting one first differential line pair;

the third line layer being provided with at least one third metal line, the fourth line layer being provided with at least one fourth metal line, and the third metal line and the fourth metal line constituting one second differential line pair;

wherein two metal lines constituting each differential line pair are arranged up and down and have different widths.

2. The circuit board as claimed in claim 1, wherein the width of the first metal line is greater than that of the second metal line, and the width of the fourth metal line is greater than that of the third metal line.

3. The circuit board as claimed in claim 1, wherein the two metal lines constituting each differential line pair both have at least one path, and the paths of the two metal lines are staggered from each other; and orthographic projections of the paths of the two metal lines are located in one projection region and interlaced with each other.

4. The circuit board as claimed in claim 3, wherein the two metal lines constituting each differential line pair both have at least one serpentine path.

5. The circuit board as claimed in claim 3, wherein one of the two metal lines constituting each differential line pair has at least one serpentine path, and the other of the two metal lines has at least one straight path;
the serpentine path and the straight path are arranged up and down and staggered from each other.

6. The circuit board as claimed in claim 5, wherein the serpentine path is disposed on the first metal line, and the straight path is disposed on the second metal line.

7. The circuit board as claimed in claim 1, wherein the insulating substrate has a first surface and a second surface, which are parallel to each other;
the second line layer is a metal layer laid on the first surface and further forms another second metal line;
the first insulating layer covers the second line layer;
the first line layer is a metal layer disposed on the first insulating layer and further forms another first metal line; the another first metal line and the another second metal line constitute a third differential line pair;
the third line layer is a metal layer laid on the second surface of the insulating substrate and further forms another third metal line;
the second insulating layer covers the third line layer; and
the fourth line layer is a metal layer disposed on the second insulating layer and further forms another fourth metal line; the another third metal line and the another fourth metal line constitute a fourth differential line pair.

8. The circuit board as claimed in claim 7, wherein the circuit board is further provided with multiple conductive through holes, each of which passes through a top surface and a bottom surface of the circuit board; each conductive through hole is corresponding to one metal line and is connected with one end of the metal line.

9. An electrical connector with the circuit board as claimed in claim 1, comprising multiple conductive terminals mounted on the circuit board; wherein each conductive terminal is electrically connected with one end of one corresponding metal line of the circuit board.

* * * * *